United States Patent
Papaleo et al.

(10) Patent No.: US 6,303,854 B1
(45) Date of Patent: Oct. 16, 2001

(54) EMI SHIELDED TELECOMMUNICATIONS ENCLOSURE

(75) Inventors: John R. Papaleo, Des Plaines, IL (US); Lester K. Grzesik, LaGrange, GA (US)

(73) Assignee: Marconi Communications, Inc., Cleveland, OH (US)

( * ) Notice: Subject to any disclaimer, the term of this patent is extended or adjusted under 35 U.S.C. 154(b) by 0 days.

(21) Appl. No.: 09/359,090

(22) Filed: Jul. 22, 1999

(51) Int. Cl.$^7$ ..................................................... H05K 9/00
(52) U.S. Cl. ..................... 174/35 R; 361/800; 361/816; 361/818; 455/300
(58) Field of Search ............................ 174/35 R, 35 GC, 174/35 MS; 361/753, 799, 800, 816, 818; 219/738, 739, 741; 455/300, 301

(56) References Cited

U.S. PATENT DOCUMENTS

| | | |
|---|---|---|
| 3,594,490 | 7/1971 | Mitchell et al. . |
| 4,081,647 * | 3/1978 | Torrey ............................. 219/10.55 D |
| 4,390,767 * | 6/1983 | Bucksbaum et al. ......... 219/10.55 D |
| 4,659,891 * | 4/1987 | Yamaguchi et al. .......... 219/10.55 D |
| 4,954,929 | 9/1990 | Baran . |
| 5,008,485 | 4/1991 | Kitagawa . |
| 5,194,691 | 3/1993 | McIlwraith . |
| 5,214,242 | 5/1993 | Gallagher . |
| 5,223,670 | 6/1993 | Hogan et al. . |
| 5,241,132 | 8/1993 | McCormack . |
| 5,452,550 * | 9/1995 | Vanesky et al. ..................... 52/173.1 |
| 5,517,069 | 5/1996 | Zibrik et al. . |
| 5,548,085 * | 8/1996 | Flores ................................. 174/35 R |
| 5,659,455 | 8/1997 | Herbert . |
| 5,847,316 | 12/1998 | Takada . |
| 6,037,046 * | 3/2000 | Joshi et al. ............................ 428/212 |

OTHER PUBLICATIONS

Ott, Henry W. "Noice Reduction Techniques in Electronic Systems" Second Edition 1988, pp. iii–iv and pp. 187–200.

* cited by examiner

*Primary Examiner*—Dean A. Reichard
*Assistant Examiner*—Carmelo Oliva
(74) *Attorney, Agent, or Firm*—Jones, Day, Reavis & Pogue

(57) ABSTRACT

An EMI shielded telecommunications equipment enclosure includes a metal cabinet structure and an access panel. The cabinet structure defines a compartment configured to contain electrical equipment that emits and is susceptible to EMI. An edge portion of the cabinet structure defines a peripheral boundary of an access opening for the compartment. The access panel includes a metal panel structure which overlies the edge portion of the metal cabinet structure when the access panel is closed. The apparatus further includes a layer of electrically nonconductive material which is interposed as a dielectric between the metal panel structure and the edge portion of the metal cabinet structure when the access panel is closed. In this configuration, a low capacitive impedance path for EMI shielding is provided between the access panel and the metal cabinet structure.

7 Claims, 5 Drawing Sheets

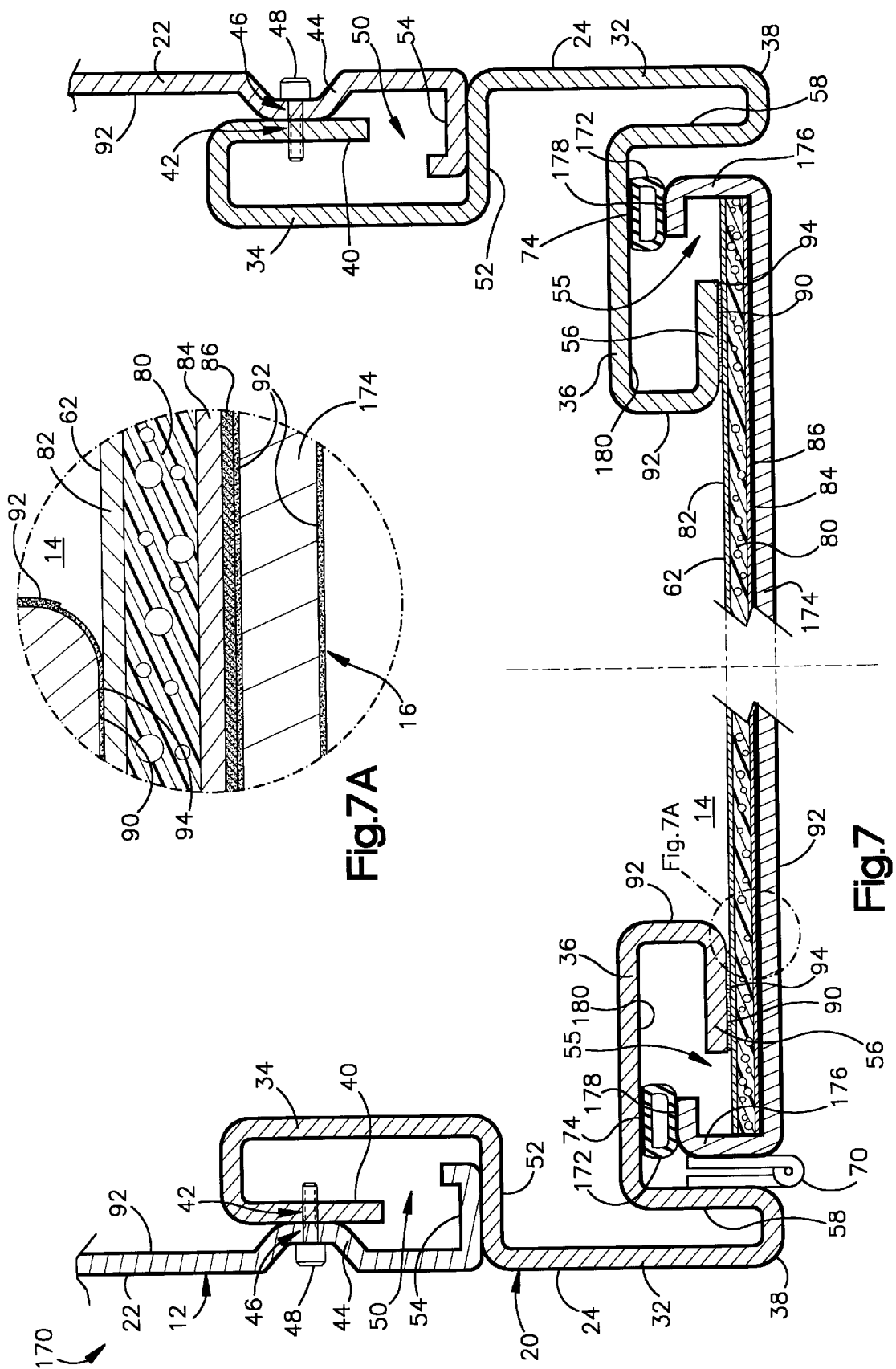

EMI SHIELDED TELECOMMUNICATIONS ENCLOSURE

FIELD OF THE INVENTION

The present invention relates to an enclosure for telecommunications equipment, and particularly relates to electromagnetic interference (EMI) shielding provided by such an enclosure.

BACKGROUND OF THE INVENTION

Telecommunications services, such as telephony, Internet and cable TV signals, can be distributed among a group of residential or commercial users by way of telecommunications equipment that is housed in an enclosure dedicated to that group of users. Such an enclosure may comprise a metal cabinet resting on a concrete pad. The cabinet has an access opening for installation and service of the telecommunications equipment within the cabinet, and has an access panel for closing the access opening. Since the telecommunications equipment emits and is susceptible to EMI, the cabinet is constructed to provide EMI shielding when the access panel is closed. However, the EMI shielding can be discontinuous across a seam between the access panel and the adjacent edge portion of the cabinet structure around the periphery of the access opening. Therefore, the access panel and the edge portion of the cabinet structure are constricted to adjoin each other in electrically conductive contact. This contact provides a low resistive impedance (LRI) path across the seam so that the EMI shielding is not unduly inhibited by the seam. The electrically conductive contact is established by and between electrically conductive gaskets, electrically conductive tape, and/or electrically conductive paint on the access panel and the cabinet structure.

SUMMARY OF THE INVENTION

In accordance with the present invention, an EMI shielded telecommunications equipment enclosure comprises a metal cabinet structure and an access panel. The cabinet structure defines a compartment configured to contain electrical equipment that emits and is susceptible to EMI. An edge portion of the cabinet structure defines a peripheral boundary of an access opening of the compartment. The access panel includes a metal panel structure. When the access panel is closed, the metal panel structure extends across the access opening and overlies the edge portion of the metal cabinet structure. The apparatus further includes a layer of electrically nonconductive material that is interposed as a dielectric between the metal panel structure and the edge portion of the metal cabinet structure when the access panel is closed. In this configuration, a low capacitive impedance (LCI) path for EMI shielding is provided between the access panel and the metal cabinet structure when the access panel is closed.

BRIEF DESCRIPTION OF THE DRAWINGS

The present invention will be apparent to those skilled in the art upon reading the following description in view of the accompanying drawings, wherein:

FIG. 2A is an enlarged partial view of parts shown in FIG. 2;

FIG. 7 is a view similar to FIG. 2 showing parts of an enclosure comprising a sixth embodiment of the invention; and FIG. 7A is an enlarged partial view of parts shown in FIG. 7.

DESCRIPTION OF PREFERRED EMBODIMENTS

Figure 1:
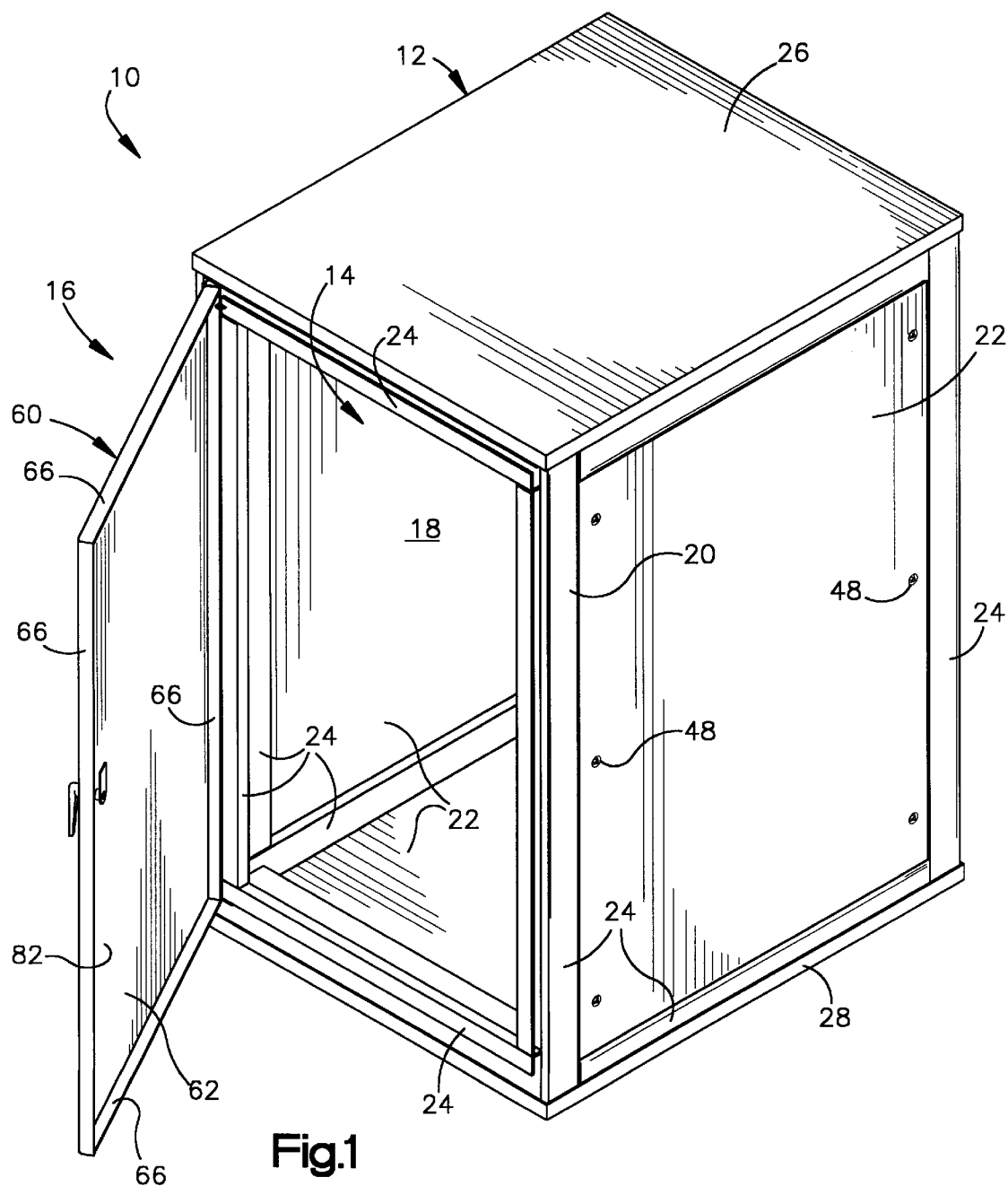
FIG. 1 is an isometric view of an EMI shielded electrical equipment enclosure comprising a first embodiment of the invention.

An apparatus 10 comprising a first embodiment of the present invention is shown in FIG. 1. The apparatus 10 is an outdoor enclosure for telecommunications equipment, and includes a cabinet structure 12 with an access opening 14. The enclosure 10 in the first embodiment further includes an access panel 16 in the form of a door. A compartment 18 in the cabinet structure 12 is configured to contain telecommunications or other electrical equipment that emits and is susceptible to EMI. The EMI shielding provided by the cabinet structure 12 is discontinuous across the access opening 14. When the door 16 is closed, it extends fully across the access opening 14, but a seam is then defined around the periphery of the opening 14 between the door 16 and the cabinet structure 12. The present invention completes the EMI shielding across the seam by providing a low capacitive impedance (LCI) path between the door 16 and the cabinet structure 12 when the door 16 is closed.

As shown in FIG. 1, the cabinet structure 12 in the first embodiment includes a rectangular metal frame 20 upon which rectangular metal wall panels 22 are mounted to close the top, bottom, and three sides of the compartment 18. The frame 20 in the first embodiment is defined by elongated aluminum frame members 24 that are interconnected by the wall panels 22. Upper and lower metal cap structures 26 and 28 are mounted on the frame 20 to provide weather protection when the enclosure 10 is installed outdoors.

Figure 2:
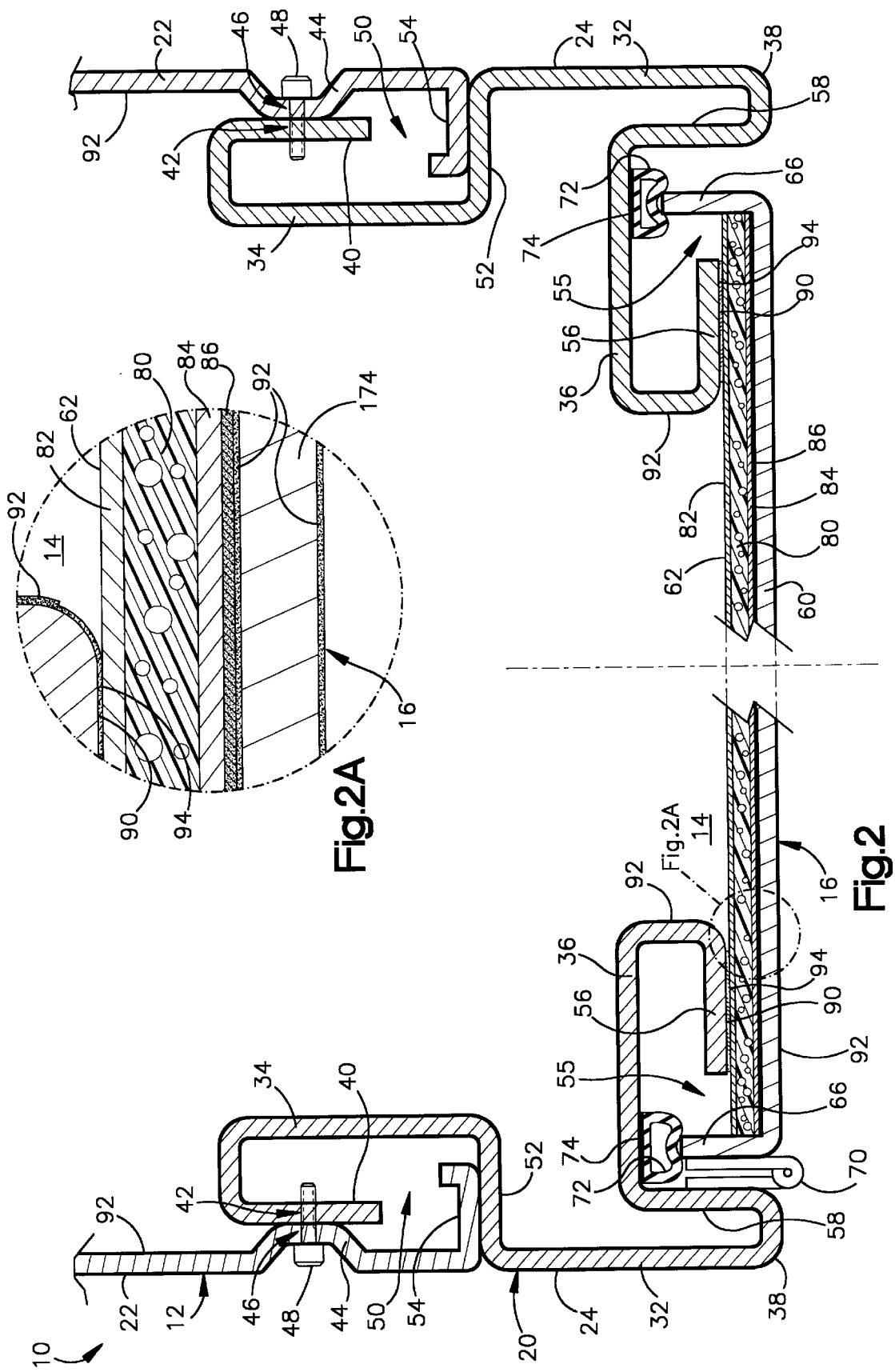
FIG. 2 is a sectional view of the enclosure of FIG. 1.

As shown in FIG. 2, each frame member 24 has three major sections 32, 34 and 36 in a somewhat serpentine cross-sectional configuration. The first section 32 defines a respective corner 38 of the frame 20. The second section 34 projects from the corner section 32 in a generally C-shaped configuration. A terminal edge portion 40 of the second section 34 has a plurality of longitudinally spaced-apart apertures 42. The adjacent wall panel 22 has a corresponding plurality of recessed portions 44 with aligned apertures 46 through which fasteners 48 are received to fasten the wall panel 22 to the frame member 24. The generally C-shaped configuration provides a gap 50 between the terminal edge portion 40 and an inwardly extending base portion 52. A turned-back edge portion 54 of the adjacent wall panel 22 is received in the gap 50.

The third section 36 of the frame member 24 has nearly the same size and shape as the second section 34, as viewed in cross section in FIG. 2. The third section 36 thus has a gap 55 between a terminal edge portion 56 and an inwardly extending base portion 58. As further shown in FIG. 2, the third section 36 projects from the corner section 32 orthogonally relative to the second section 34, and is oriented oppositely relative to the second section 34. Each third section 36 is thus configured to engage and support an adjacent wall panel 22 or, as shown in FIG. 2, to define a peripheral boundary of the access opening 14.

The door 16 in the first embodiment of the invention is a multi-part structure including a major door panel 60 and a thermal insulation panel 62. The major door panel 60 defines the size and the rectangular peripheral shape of the door 16. Flanges 66 project inward along the four side edges of the major door panel 60. One of the vertically extending flanges 66 is connected to the adjacent frame member 24 by a piano hinge 70 in the corresponding gap 55. When the door 16 is in the closed position of FIG. 2, gaskets 72 in the gaps 55 are deflected compressively between the frame members 24 and the flanges 66. This provides an outdoor environmental seal between the door 16 and the metal cabinet structure 12. The gaskets 72 are strips of electrically nonconductive, elastomeric material, as known in the art, and are preferably mounted on the frame members 24 by adhesive bonds 74.

The insulation panel 62 is a laminate structure including a bubble layer of polyethylene 80 sandwiched between inner and outer layers of aluminum 82 and 84. An adhesive bond 86 supports the insulation panel 62 on the major door panel 60. When the door 16 is in the closed position of FIG. 2, the inner aluminum layer 82 adjoins the four frame members 24 at the periphery of the access opening 14. Specifically, the inner aluminum layer 82 overlies the third section 36 of each adjacent frame member 24 at the terminal edge portion 56 of the third section 36.

In the first embodiment of the invention, the outer surfaces 90 of the terminal edge portions 56 are unpainted, whereas all or substantially all of the other surfaces of the frame members 24 at the access opening 14 are preferably covered by at least one coating of paint 92. A thin layer 94 of aluminum oxide forms on each unpainted outer surface 90. Each layer 94 of aluminum oxide has a dielectric constant of 5 or more. When the door 16 is closed, the layers 94 of aluminum oxide are interposed as dielectrics between the aluminum edge portions 56 of the cabinet stricture 12 and the inner aluminum layer 82 of the insulation panel 62. The cabinet structure 12 and the multi-part door structure 16 are thus configured in accordance with the present invention to define elongated capacitor structures extending fully and continuously around the four sides of the access opening 14. This results in an LCI path for EMI shielding between the door 16 and the cabinet structure 12 when the door 16 is closed.

Figure 3:
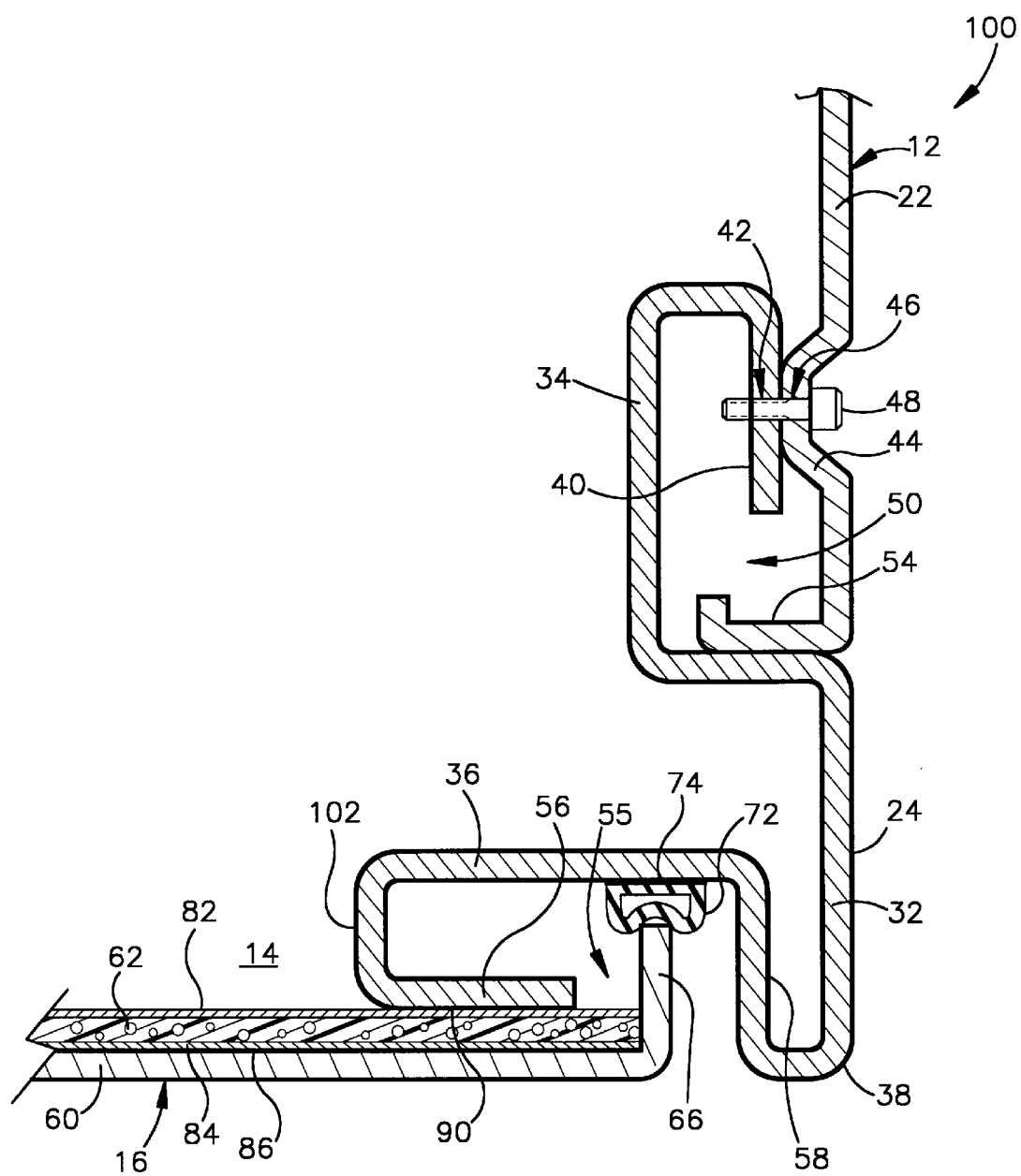
FIG. 3 is a sectional view of parts of an enclosure comprising a second embodiment of the invention.

A second embodiment of the present invention is shown partially in FIG. 3. The second embodiment also is an outdoor telecommunications equipment enclosure 100. The enclosure 100 has many parts that are substantially the same as corresponding parts of the enclosure 10 described above. This is indicated by the use of the same reference numbers for such corresponding parts in FIGS. 2 and 3. For example, the enclosure 100 includes a metal cabinet structure 12 with frame members 24 defining an access opening 14, and further includes a multi-part door structure 16 for closing the access opening 14.

As in the first embodiment, outdoor environmental seals are defined by gaskets 72 on the frame members 24 when the door structure 16 in the second embodiment is closed. An aluminum layer 82 on a thermal insulation panel 62 then overlies the terminal edge portions 56 of the adjacent frame members 24. However, each outer surface 90 at the terminal edge portions 56 in the second embodiment is covered by a coating of electrically nonconductive paint 102. The paint 102 (as well as the paint 92 described above) preferably is a known product commonly referred to as powder paint. When the door structure 16 in the second embodiment is closed, the coatings of paint 102 on the outer surfaces 90 are interposed as dielectrics between the aluminum edge portions 56 of the cabinet structure 12 and the inner aluminum layer 82 of the insulation panel 62. The cabinet structure 12 and the multi-part door structure 16 in the second embodiment are thus configured to provide an LCI path for EMI shielding in accordance with the present invention.

Figure 4:
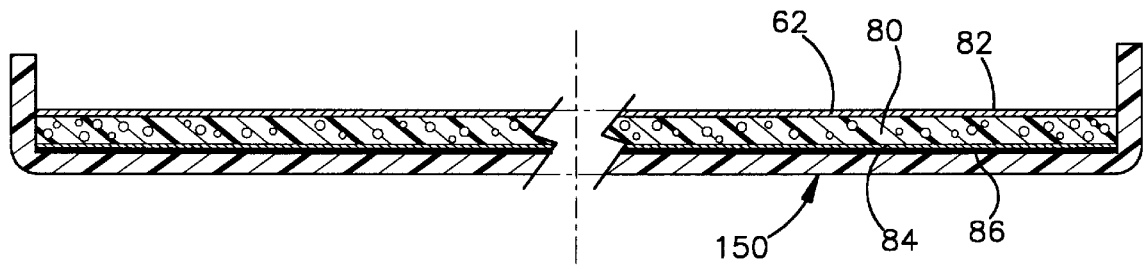
FIG. 4 is a sectional view of a part of an enclosure comprising a third embodiment of the invention.

In a third embodiment of the invention, an enclosure can include an alternative major door panel like the major door panel 150 shown in FIG. 4. Unlike the major door panels described above, which are formed of sheet metal, the major door panel 150 of FIG. 4 is formed of an electrically nonconductive material, e.g., a plastic material. The plastic material may include additives such as stabilizers, fillers, reinforcements, and the like. The use of the thermal insulation panel 62 in accordance with the present invention enables the use of the plastic major door panel 150 because LCI is provided by the inner metal layer 82 of the thermal insulation panel 62.

Figure 5:
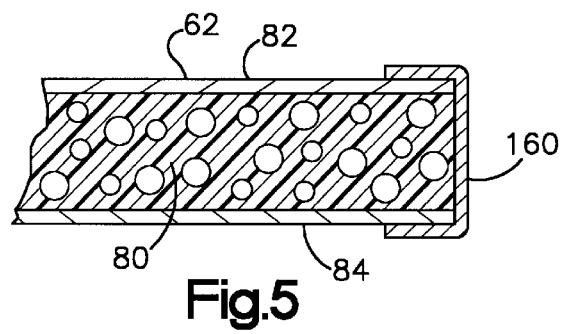
FIG. 5 is a sectional view of parts of an enclosure comprising a fourth embodiment of the invention.
Figure 6:
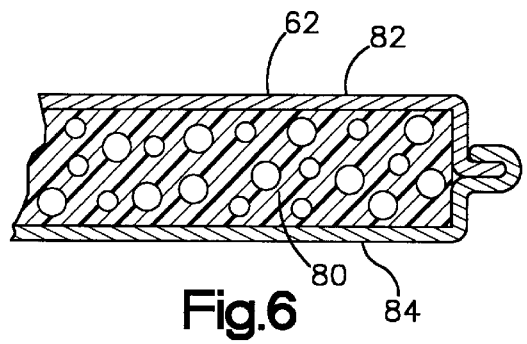
FIG. 6 is a view similar to FIG. 5 showing parts of an enclosure comprising a fifth embodiment of the invention.

Fourth and fifth embodiments of the invention are shown partially in FIGS. 5 and 6, respectively. As shown in FIG. 5, the aluminum layers 82 and 84 of the thermal insulation panel 62 are interconnected by strips of electrically conductive tape 160 at their peripheral edges. This is found to enhance the EMI shielding provided by the invention. In a variation of this feature, the aluminum layers 82 and 84 can be crimped, fused, or otherwise joined directly together, as shown in FIG. 6.

An outdoor enclosure 170 comprising a sixth embodiment of the invention is shown partially in FIG. 7. The enclosure 170 also has many parts that are substantially the same as corresponding parts of the enclosure 10 described above, as indicated by the use of the same reference numbers for such corresponding parts in FIGS. 2 and 7. The enclosure 170 thus includes a metal cabinet structure 12 with frame members 24 defining an access opening 14. The terminal edge portions 56 of the frame members 24 have layers of aluminum oxide 94 on unpainted outer surfaces 90 that extend fully around the four sides of the access opening 14. An LCI path for EMI shielding is provided in accordance with the invention when the inner aluminum layer 82 on the insulation panel 62 adjoins the aluminum oxide layers 94, as shown in FIG. 7.

The enclosure 170 in the sixth embodiment includes alternative gaskets 172. The enclosure 170 further includes an alternative major door panel 174 with peripheral flanges 176. The flanges 176 have inner side surfaces 178 parallel to the outer side surfaces 180 at which the gaskets 172 are bonded to the frame members 24. Those surfaces 178 of the flanges 176 are sized to engage the corresponding gaskets 172 over areas that are wider than the areas at which the flanges 66 of FIG. 2 engage the corresponding gaskets 72. This provides the enclosure 170 with a more extensive environmental seal. Each of the other door panels 60 and 150 shown in FIGS. 2–4 could be modified in accordance with this feature of the invention.

The invention has been described with reference to preferred embodiments. Those skilled in the art will perceive improvements, changes and modifications. For example, the preferred embodiments described above are outdoor enclosures that have environmental seals surrounding the access openings. The present invention can be used with an outdoor enclosure that does not have an environmental seal, or with an indoor enclosure, either with or without an environmental seal. Such improvements, changes and modifications are intended to be covered by the appended claims.

We claim:

1. An EMI shielded telecommunications equipment enclosure comprising;
 a metal cabinet structure defining a compartment configured to contain electrical equipment that emits and is susceptible to EMI, said metal cabinet structure having an edge portion defining a peripheral boundary of an access opening for said compartment, said edge portion having a first planar surface;
 an access panel including a metal panel structure which extends across said access opening, and which has a second planar surface that overlies said first planar surface of said edge portion of said metal cabinet structure when said access panel is in a closed position; and
 a flat layer of electrically nonconductive material having planar opposite side surfaces, said flat layer of electrically nonconductive material being interposed as a dielectric between said first planar surface of said edge portion of said metal cabinet structure and said second planar surface of said metal panel structure when said access panel is in said closed position, such that said edge portion, said metal panel structure, and said flat layer together define a parallel plate capacitor having a low impedance when said access panel is in said closed position.

2. An enclosure as defined in claim 1 wherein said edge portion of said metal cabinet structure is formed of aluminum and has an unpainted surface, and said planar layer of electrically nonconductive material is a layer of aluminum oxide on said unpainted surface.

3. An enclosure as defined in claim 1 wherein said access panel comprises a major door panel and a peripheral flange perpendicular to said major door panel, said enclosure further comprising a strip of electrically nonconductive elastomeric material which is engaged compressively by and between an edge of said flange and said cabinet structure to define an environmental seal when said access panel is in said closed position.

4. An EMI shielded telecommunications equipment enclosure comprising:
 a metal cabinet structure defining a compartment configured to contain electrical equipment that emits and is susceptible to EMI, said metal cabinet structure having an edge portion defining a peripheral boundary of an access opening for said compartment, said edge portion having a first planar surface;
 an access panel which extends across said access opening and overlies said edge portion of said metal cabinet structure when said access panel is in a closed position, said access panel including a major panel defining the peripheral size and shape of said access panel, and further including a metal panel mounted on said major panel, said metal panel having a second planar surface that overlies said first planar surface; and
 a flat layer of electrically nonconductive material having planar opposite side surfaces, said flat layer of electrically nonconductive material being interposed as a dielectric between said first planar surface of said edge portion of said metal cabinet structure and said second planar surface of said metal panel when said access panel is in said closed position, such that said edge portion, said metal panel, and said flat layer together define a parallel plate capacitor having a low impedance when said access panel is in said closed position.

5. An enclosure as defined in claim 4 wherein said metal panel is an inner metal layer of a laminate structure which is mounted on said major panel, and said laminate structure includes a layer of electrically nonconductive thermal insulation material between said inner metal layer and said major panel.

6. An enclosure as defined in claim 4 wherein said edge portion of said metal cabinet stricture is formed of aluminum and has an unpainted surface, and said layer of electrically nonconductive material is a layer of aluminum oxide on said unpainted surface.

7. The enclosure as defined in claim 4 wherein said access panel has a peripheral flange perpendicular to said major panel, and said enclosure further comprises a strip of electrically nonconductive elastomeric material which is engaged compressively by and between an edge of said flange and said cabinet structure to define an environmental seal when said access panel is in said closed position.

\* \* \* \* \*

UNITED STATES PATENT AND TRADEMARK OFFICE
CERTIFICATE OF CORRECTION

PATENT NO.    : 6,303,854 B1                                      Page 1 of 1
DATED         : October 16, 2001
INVENTOR(S)   : Papaleo et al.

It is certified that error appears in the above-identified patent and that said Letters Patent is hereby corrected as shown below:

Column 1,
Line 26, delete "constricted" insert -- constructed- --.

Column 2,
Lines 45 and 46, delete "comer" insert -- corner --.

Signed and Sealed this

Twenty-eighth Day of May, 2002

Attest:

JAMES E. ROGAN
Attesting Officer     Director of the United States Patent and Trademark Office